United States Patent
Arai et al.

(10) Patent No.: US 11,853,484 B2
(45) Date of Patent: Dec. 26, 2023

(54) WATERPROOF ELECTRONIC PEN

(71) Applicant: Wacom Co., Ltd., Saitama (JP)

(72) Inventors: Takayuki Arai, Saitama (JP); Kenichi Ninomiya, Saitama (JP); Takenori Kaneda, Saitama (JP)

(73) Assignee: Wacom Co., Ltd., Saitama (JP)

(*) Notice: Subject to any disclaimer, the term of this patent is extended or adjusted under 35 U.S.C. 154(b) by 459 days.

(21) Appl. No.: 17/133,057

(22) Filed: Dec. 23, 2020

(65) Prior Publication Data

US 2021/0117019 A1    Apr. 22, 2021

Related U.S. Application Data

(63) Continuation of application No. PCT/JP2019/018321, filed on May 8, 2019.

(30) Foreign Application Priority Data

Jul. 20, 2018  (JP) ................. 2018-136994

(51) Int. Cl.
*G06F 3/0354* (2013.01)
*H05K 1/18* (2006.01)
*H05K 3/28* (2006.01)

(52) U.S. Cl.
CPC .......... *G06F 3/03545* (2013.01); *H05K 1/181* (2013.01); *H05K 3/284* (2013.01); *H05K 2203/1316* (2013.01)

(58) Field of Classification Search
CPC .... G06F 3/03545; H05K 1/181; H05K 3/284; H05K 2203/1316
USPC ...................................................... 345/179
See application file for complete search history.

(56) References Cited

U.S. PATENT DOCUMENTS

| | | | |
|---|---|---|---|
| 2005/0185842 A1* | 8/2005 | Williams | G06V 30/142 382/187 |
| 2016/0349865 A1 | 12/2016 | Arai et al. | |
| 2017/0285775 A1* | 10/2017 | Park | G06F 3/03545 |
| 2018/0024650 A1 | 1/2018 | Hou et al. | |

(Continued)

FOREIGN PATENT DOCUMENTS

| | | | | |
|---|---|---|---|---|
| JP | 2018-18149 A | | 2/2018 | |
| KR | 2018075441 A | * | 7/2018 | ......... G06F 3/03545 |

(Continued)

OTHER PUBLICATIONS

International Search Report, dated Jul. 9, 2019, for International Application No. PCT/JP2019/018321, 1 page.

(Continued)

*Primary Examiner* — Mark Edwards
(74) *Attorney, Agent, or Firm* — Seed IP Law Group LLP

(57) ABSTRACT

A highly reliable waterproof electronic pen includes a board holder in a board housing including a recessed portion having an opening over a lower surface of the recessed portion. A circuit board is housed in the recessed portion of the board housing. Circuit components easily affected by heat are installed on a first surface of the circuit board, and circuit components not easily affected by heat are installed on a second surface of the circuit board. A thermosetting resin formed over the second surface of the circuit board when the circuit board is housed in the recessed portion seals the opening over the lower surface of the recessed portion of the board housing.

8 Claims, 5 Drawing Sheets

(56) References Cited

U.S. PATENT DOCUMENTS

| | | |
|---|---|---|
| 2018/0024657 A1 | 1/2018 | Ninomiya et al. |
| 2018/0364823 A1 | 12/2018 | Kamiyama et al. |
| 2019/0223318 A1* | 7/2019 | Inoue .................. H05K 7/209 |
| 2019/0294269 A1 | 9/2019 | Ninomiya et al. |

FOREIGN PATENT DOCUMENTS

| | | |
|---|---|---|
| WO | 2015/122280 A1 | 8/2015 |
| WO | 2017/149879 A1 | 9/2017 |

OTHER PUBLICATIONS

German Office Action, dated Oct. 13, 2021, for German Application No. 112019003668.8, 14 pages (with machine-generated English Translation).

Lück, et al., "Pressure Tolerant Systems for Deep Sea Applications," *Oceans* '10 IEEE Sydney, pp. 1-4, 2010, 4 pages.

\* cited by examiner

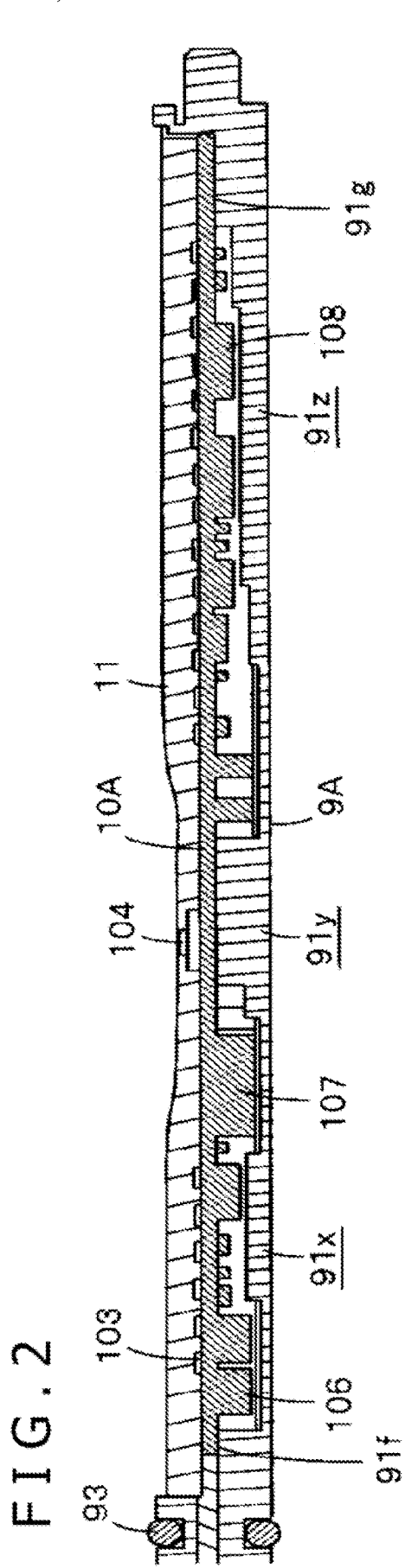

WATERPROOF ELECTRONIC PEN

BACKGROUND

Technical Field

The invention relates to a waterproof electronic pen used as a position indicator (stylus) for a position detection apparatus.

Description of the Related Art

In recent years, electronic pens can be used to input information in more electronic devices, such as a high-performance portable phone terminal that is called a smartphone or the like and a tablet PC (Personal Computer). FIG. 4 illustrates an example of an electronic device in which an electronic pen 1 can be used. An electronic device 200 in the example includes, for example, a display apparatus, such as an LCD (Liquid Crystal Display), and a position detection apparatus 202 including a position detection sensor corresponding to a display screen 200D of the display apparatus. Although there are various types of position detection apparatuses 202, such as an electro-magnetic resonance system and a capacitive coupling system, the position detection apparatus 202 in the description here is, for example, an apparatus of the electro-magnetic resonance system.

When the electronic pen 1 is not in use, the electronic pen 1 can be housed in a housing recessed hole 201 provided in a housing of the electronic device 200 and can be carried along with the electronic device 200. Then, the electronic pen 1 is taken out from the housing recessed hole 201 and used as necessary. The electronic pen 1 includes a plurality of components lined up in an axial direction and housed in a hollow section of a cylindrical housing (case) 2 made of, for example, a resin. A front end portion 32 of a core 3 protrudes as a nib from a front end on a nib side of the electronic pen 1, and a cap 21 is fitted to an end portion on an opposite side of the nib side to seal the installed components. In addition, the electronic pen 1 includes a press operator 22 for a side switch provided on a side surface of the housing 2.

Moreover, the electronic device 200 and the electronic pen 1 are often used in environments easily affected by water, such as outdoors in the rain and in water areas including oceans, rivers, lakes, and pools. Therefore, waterproof measures for the electronic pen 1 in addition to the electronic device 200 are considered increasingly important. The waterproof measures for the electronic pen 1 are disclosed in, for example, Patent Documents 1 to 3 described later. A technique of entire sealing for shielding all of the important components, such as a coil and a circuit board, is disclosed in Patent Document 1. A technique of partial sealing for shielding only the circuit board part is disclosed in Patent Document 2. A technique of providing waterproof elastic members (cap member and sealing member) on the nib side and on the circuit board connection part inside of the housing to prevent an influx of water or the like from an outside is disclosed in Patent Document 3.

PRIOR ART DOCUMENTS

Patent Documents

Patent Document 1: PCT Patent Publication No. WO 2015/122280

Patent Document 2: PCT Patent Publication No. WO 2017/149879

Patent Document 3: Japanese Patent Laid-Open No. 2018-18149

BRIEF SUMMARY

Technical Problems

Various components as illustrated in FIG. 5 are installed in the hollow section of the housing 2 of the electronic pen 1 illustrated in FIG. 4. That is, the core 3, a cap member 4, a coil member 5, a coil member holder 6, a pressing member 7, a pen pressure detection module 8, and a board holder 9 are linked in the axial direction, and a circuit board (printed board) 10 is housed in the board holder 9. In the example, the core 3 includes a core body portion 31 and the front end portion 32 which is the nib, the coil member 5 includes a coil 51 and a ferrite core 52, and the pen pressure detection module 8 includes a pen pressure detector 81 and a pen pressure transmission member 82.

In addition, the board holder 9 includes a box-shaped board housing portion 91 without a lid and a fitting portion 92. The vertical and horizontal lengths of a recessed portion 91a of the board housing portion 91 are slightly longer than the vertical and horizontal lengths of the circuit board 10, and the depth of the recessed portion 91a is substantially equal to the thickness of the circuit board 10. As a result, the entire circuit board 10 is housed in the recessed portion 91a. Moreover, a ring-shaped sealing member 93 is provided on an end portion (boundary part of the fitting portion 92 and the board housing portion 91) on the nib side of the board housing portion 91. The circuit board 10 is provided with, for example, conductor patterns 101 and 102 that form a connection terminal, a circuit element such as a capacitor, a side switch, and the like.

The invention described in Patent Document 3 described above is applied to an internal configuration of the electronic pen 1 illustrated in FIG. 5, and the cap member 4 and the sealing member 93 function as waterproof sealing members. That is, the cap member 4 prevents an influx of water or the like from the nib side. In addition, as illustrated in FIG. 4, the cap 21 is provided on a back end portion of the electronic pen 1 and fitted to the housing 2, and there is basically no influx of water or the like from a back end side. However, even if a slight amount of water or the like enters from the back end side, the sealing member 93 can prevent an influx of water or the like toward the pen pressure detection module 8.

Therefore, as described with reference to FIG. 5, if the coil member 5 and the pen pressure detection module 8 can be isolated, an electronic pen with stronger waterproof measures can be realized by sealing the electronic circuit part of the circuit board 10 with a hot-melt adhesive or the like. However, the functions requested for the electronic pens are increasing in recent years, and complicated electronic circuits have started being installed. Accordingly, circuit boards provided with more circuit components than in the conventional electronic pens are also used in the electronic pens.

A hot-melt adhesive may also be used to seal the circuit board provided with more circuit components than in the conventional electronic pens. However, the hot-melt adhesive is an adhesive in a state melted by heat of 80 to 100 degrees, and when the adhesive is used for sealing, the heat is transmitted to the circuit components although temporarily. Some of the circuit components installed on the circuit board need to be adjusted again when some heat is applied from the surroundings. Therefore, there is a request for a first issue of preventing the circuit components from being affected by heat in the circuit board provided with many circuit components to thereby realize an electronic pen in which an appropriate waterproof action is conducted by, for example, using a hot-melt adhesive for sealing.

In addition, a gap may be generated between the circuit board and the board housing portion 91 when the circuit board subjected to the waterproof action of, for example, using a hot-melt adhesive or the like for sealing is installed on the recessed portion 91a of the board housing portion 91 of the board holder 9. When the electronic pen with the gap between the installed circuit board and the board housing portion 91 is, for example, accidentally dropped in the water, the gap part is compressed by water pressure, and the electronic pen 1 may be warped and deformed.

In this case, the circuit components installed on the circuit board may be stressed, and the characteristics of the circuit components may be changed so that the circuit components do not normally operate. In addition, when the circuit board 10 and the board holder 9 are warped and deformed, the side switch part installed on the circuit board 10 may be moved toward the housing 2, and the side switch may continuously be pressed by the press operator 22 provided on the housing 2. Therefore, there is a request for a second issue of realizing an electronic pen sufficiently resistant to water pressure.

In view of the above, an object of the invention is to provide a highly reliable waterproof electronic pen provided with, first, a highly waterproof function and, second, resistance to water pressure so that a change in characteristics of circuit components or an erroneous operation of a side switch does not occur.

Technical Solutions

To solve the first issue, provided is a waterproof electronic pen including a board housing including a recessed portion having an opening over a lower surface of the recessed portion. The waterproof electronic pen includes a board holder in a housing. The board holder is configured to hold a circuit board in the recessed portion of the board housing. The waterproof electronic pen is configured to transmit a position indication signal. Circuit components including first components arranged on a first surface and, a press switch and a capacitor arranged on the a second surface of the circuit board, wherein the first surface faces the lower surface of the recessed portion of the board housing, and a thermosetting resin a thermosetting resin formed over the second surface of the circuit board seals the opening over the lower surface of the recessed portion of the board housing.

According to the waterproof electronic pen, a two-layer board (two-surface structure) including a first surface and a second surface is used as the circuit board. The first surface of the board is arranged to face inside of the board housing, and circuit components with characteristics changed by heat are installed on the first surface. A side switch, a chip capacitor, and the like with characteristics relatively unlikely to be changed by heat are arranged on the second surface of the circuit board facing an outside, and for example, a hot-melt adhesive is then used for sealing.

As a result, the hot-melt adhesive can prevent water or the like from entering the board holder, that is, between the bottom surface side of the board holder and the circuit board. Therefore, in addition to the circuit part sealed by the thermosetting resin, the circuit part not sealed by the thermosetting resin can also be waterproof. Moreover, the circuit components with characteristics relatively unlikely to be changed by heat are installed on the circuit part sealed by the thermosetting resin, and therefore, the circuit components with characteristics changed by heat are not affected by the thermosetting resin.

To solve the second issue, provided is a waterproof electronic pen including a board housing including a recessed portion having an opening over a lower surface of the recessed portion. The waterproof electronic pen includes a board holder in the board housing. The board holder is configured to hold a circuit board in the recessed portion of the board housing. The waterproof electronic pen is configured to transmit a position indication signal. The lower surface of the recessed portion of the board housing facing a first surface of the circuit board housed in the recessed portion of the board housing includes a plurality of projected portions that fill a space between the circuit board and the lower surface of the recessed portion of the board housing provided according to circuit components on the first surface of the circuit board and that form recessed and projected areas, and a sealing member that seals the opening over the lower surface of the recessed portion of the board housing, wherein the sealing member is disposed on a second surface of the circuit board housed in the recessed portion of the board housing.

According to the waterproof electronic pen, the board holder installed in the housing includes the board housing having the opening over having an opening over a lower surface of lower surface of the recessed portion. The circuit board is housed in the recessed portion of the board housing. On the lower surface of the recessed portion facing the first surface of the circuit board housed in the recessed portion of the board housing portion, the projected portions are provided according to the circuit components on the first surface of the circuit board, and the recessed and projected areas are formed on the lower surface. Therefore, the space between the circuit board and the lower surface of the recessed portion is filled by the projected portions. In addition, the sealing member seals the opening over the lower surface of the recessed portion of the board housing from the second surface of the circuit board housed in the board housing.

As a result, the circuit board can be surely waterproofed, and the space between the circuit board and the bottom surface of the recessed portion of the board housing is filled by the projected portions. This can prevent water from entering the housing even if the waterproof electronic pen is dropped in the water, and this can also prevent the space between the circuit board and the lower surface of the recessed portion of the board housing portion from being compressed by water pressure which causes warpage and deformation of the waterproof electronic pen.

BRIEF DESCRIPTION OF THE DRAWINGS

FIG. 2 is a cross-sectional view of the board holder and the circuit board part of the waterproof electronic pen according to the embodiment of the present disclosure.

DETAILED DESCRIPTION

Hereinafter, an embodiment of a waterproof electronic pen according to the invention will be described with reference to the drawings. In a waterproof electronic pen 1A of the embodiment described below, the same reference symbols will be used for parts configured similarly to the parts illustrated in FIGS. 4 and 5, and the parts will be described with reference to FIGS. 4 and 5. Moreover, in the waterproof electronic pen 1A of the embodiment, parts different from the configurations illustrated in FIG. 5 will be described in detail with reference to FIGS. 1 to 3.

Appearance and Basic Internal Structure

Figure 4:
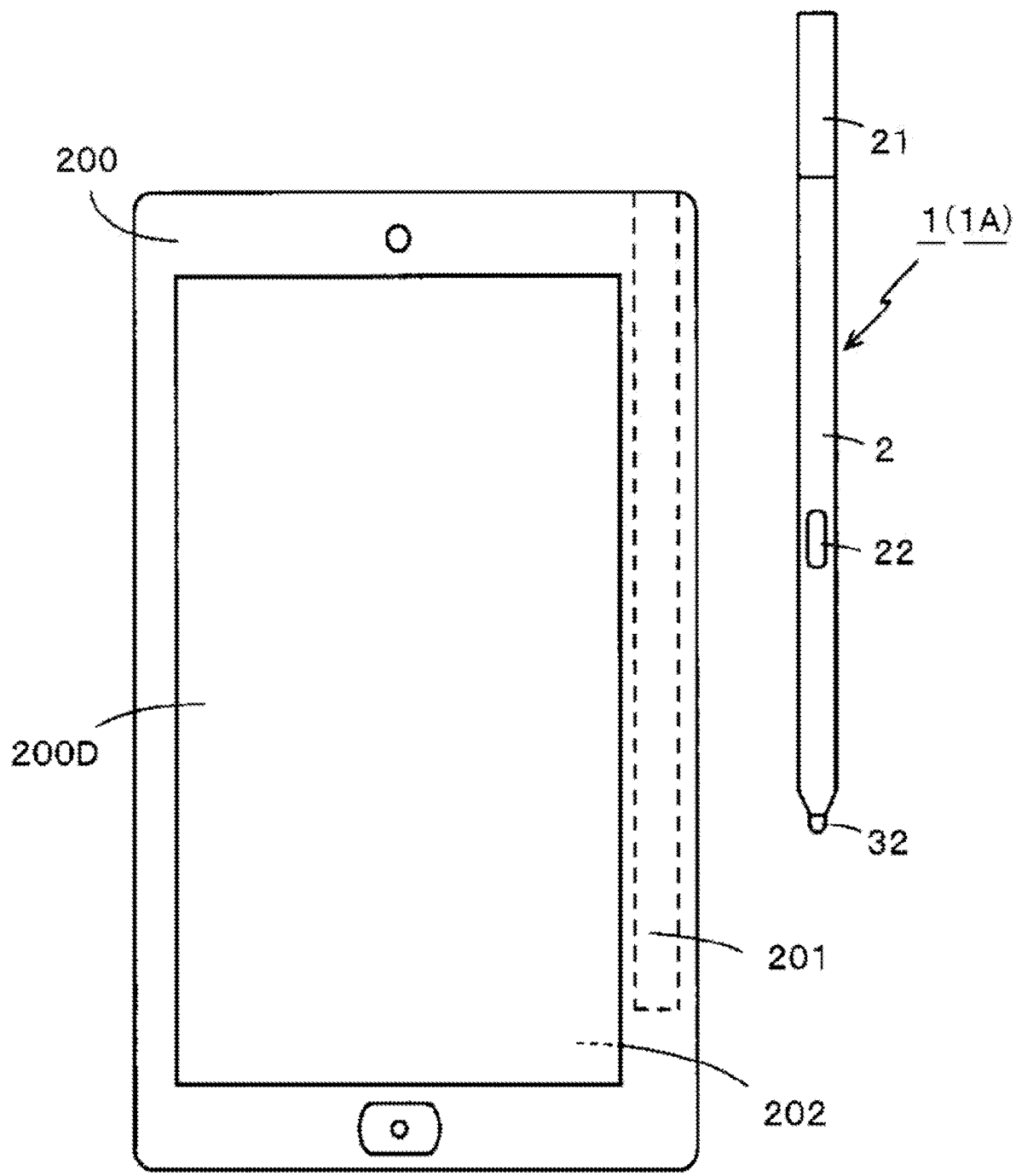
FIG. 4 is a diagram illustrating an appearance of an example of an electronic device in which information is input by an electronic pen.

The waterproof electronic pen 1A of the embodiment functions as, for example, a position indicator of the portable electronic device 200 provided with a display apparatus, such as an LCD (Liquid Crystal Display), and the position detection apparatus 202 including a position detection sensor corresponding to the display screen 200D of the display apparatus, as in a case illustrated in FIG. 4. The appearance of the waterproof electronic pen 1A of the embodiment is a pen type similar to the electronic pen 1 illustrated in FIG. 4, and various components are installed on a cylindrical housing 2 in which one end portion is tapered. A front end portion 32 of the core 3 protrudes from a tapered front end of the housing 2 to form the nib. In addition, the press operator 22 for the side switch is provided on a side surface of the housing 2. Moreover, the cap 21 is attached to the housing 2 on an end portion on an opposite side of the nib, and the components installed inside are enclosed in the housing 2.

Figure 5:
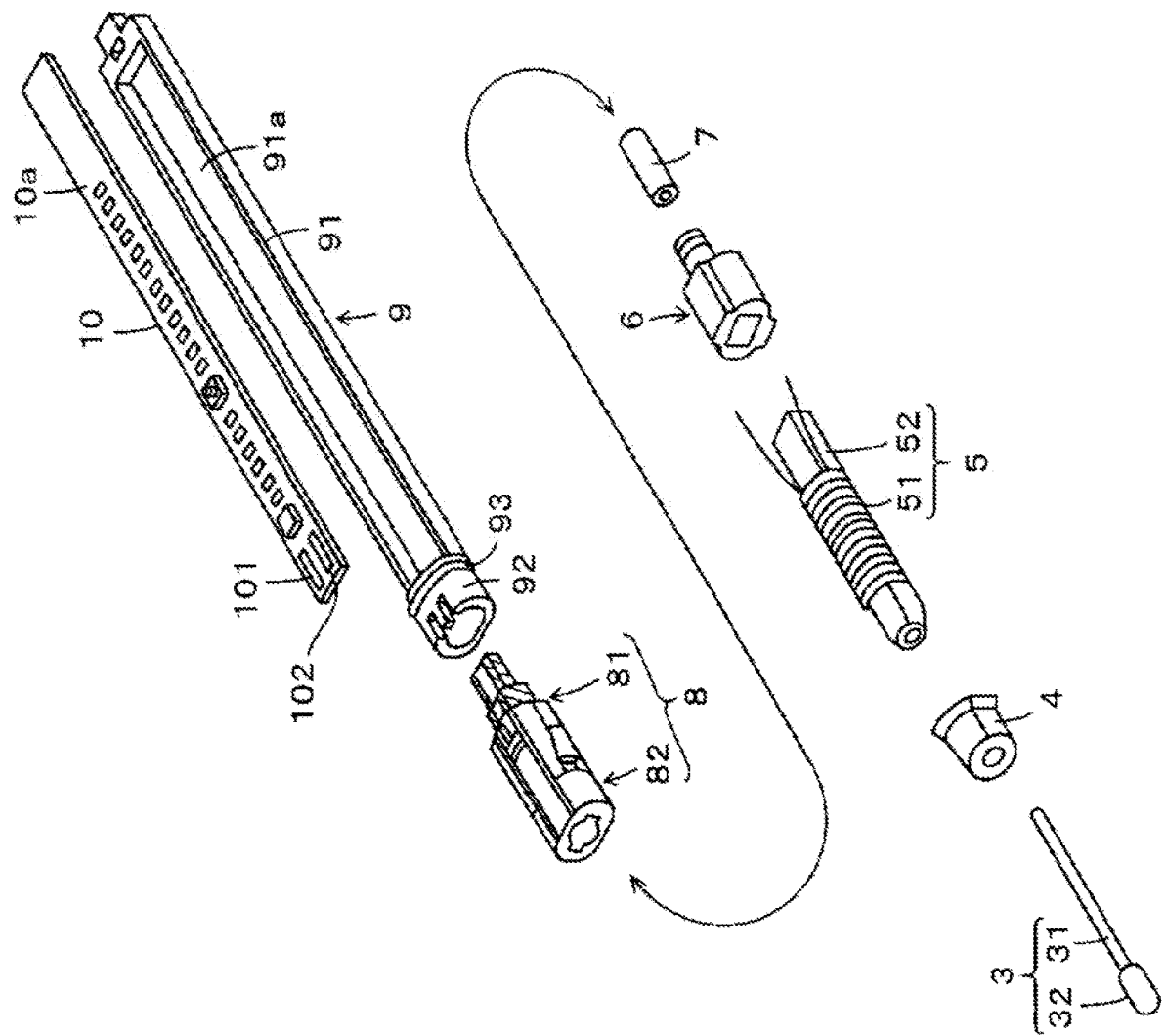
FIG. 5 is a perspective view for describing components installed in a housing of the electronic pen.

In the waterproof electronic pen 1A of the embodiment, various components are also installed in the hollow section of the housing 2 as in, for example, the electronic pen 1 illustrated in FIG. 5. That is, the core 3, the cap member 4, the coil member 5, the coil member holder 6, the pressing member 7, the pen pressure detection module 8, and the board holder 9 are also installed and linked in series in an axial direction in the hollow section of the housing 2 of the waterproof electronic pen 1A. In addition, the circuit board 10 is housed in the board holder 9 and installed on the housing 2.

Note that, in a case of the waterproof electronic pen 1A of the embodiment, a board holder 9A is included in place of the board holder 9 illustrated in FIG. 5, and a circuit board 10A is included in place of the circuit board 10. Moreover, a sealing member 11 is also provided in the waterproof electronic pen 1A of the embodiment to realize a strong waterproof function. Hereinafter, the configuration regarding the characteristic board holder 9A, circuit board 10A, and sealing member 11 in the waterproof electronic pen 1A of the embodiment will be described in detail.

Configuration of Board Holder 9A, Circuit Board 10A, and Sealing Member 11

Figure 1:
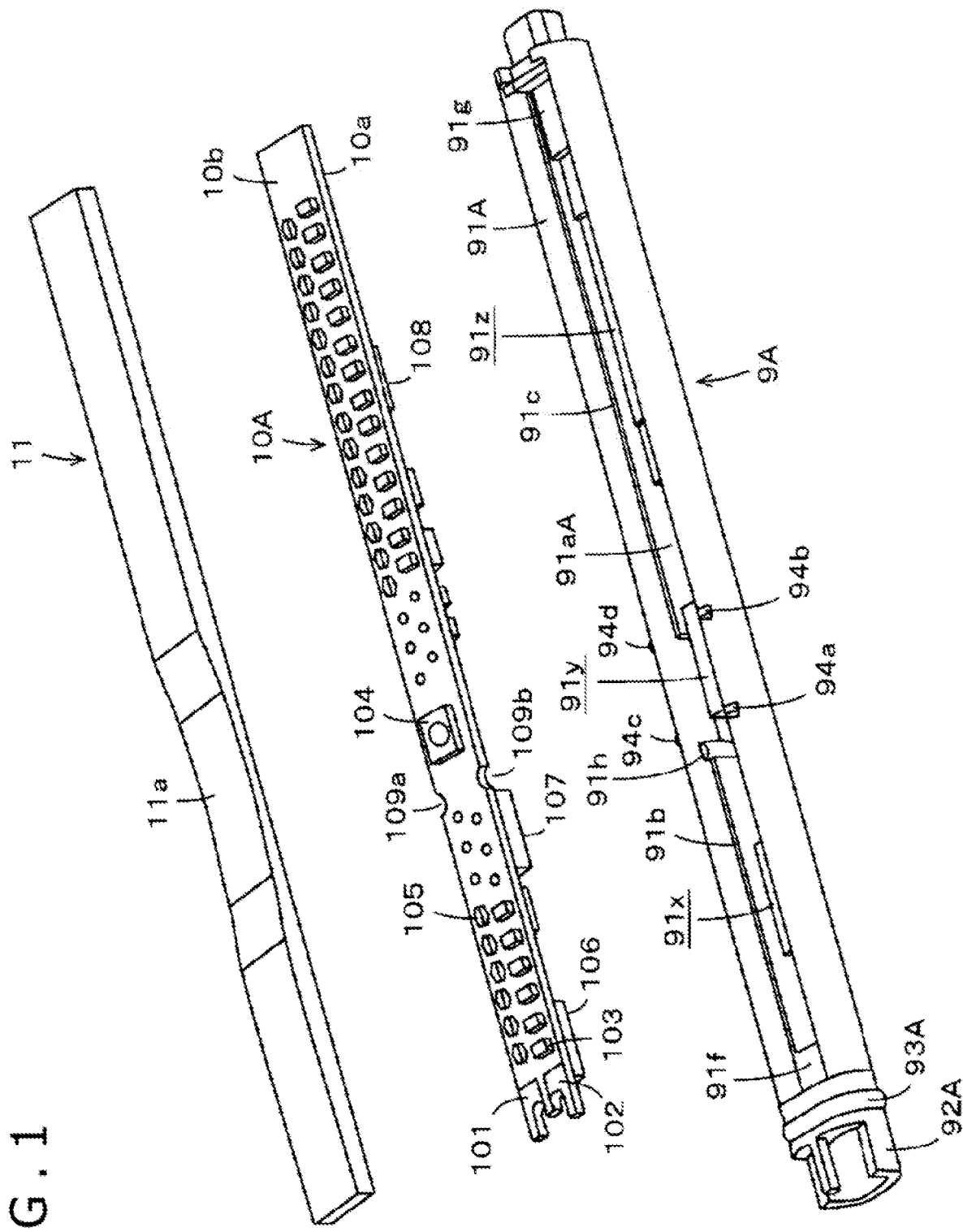
FIG. 1 is an exploded perspective view of a board holder and circuit board part of a waterproof electronic pen according to an embodiment of the present disclosure.

FIG. 1 is an exploded perspective view of the board holder 9A and circuit board 10A part of the waterproof electronic pen 1A according to the embodiment. In the case of the waterproof electronic pen 1A according to the embodiment, an electronic circuit portion integrated by housing the circuit board 10A illustrated in the center portion of FIG. 1 in the board holder 9A illustrated in the lower portion of FIG. 1 and arranging the sealing member 11 illustrated in the upper portion of FIG. 1 above the circuit board 10A is provided in a back stage of the pen pressure detection module 8 illustrated in FIG. 5. The board holder 9A includes a box-shaped board housing portion 91A including a recessed portion 91aA without a lid, and a fitting portion 92A provided on a nib side to which the pen pressure detection module 8 is fitted. A ring-shaped sealing member 93A is provided on an end portion (boundary part of the fitting portion 92A and the board housing portion 91A) on the nib side of the board housing portion 91A.

The vertical and horizontal lengths of the recessed portion 91aA of the board housing portion 91A are slightly longer than the vertical and horizontal lengths of the circuit board 10A, and the depth of the recessed portion 91aA is substantially equal to the thickness of the circuit board 10 (thickness in a state in which the circuit components are installed). As a result, the entire circuit board 10A is housed in the recessed portion 91aA. Moreover, a bottom surface of the recessed portion 91a of the board housing portion 91A is a plane without recessed and projected areas in the board holder 9 of the electronic pen 1 as illustrated in FIG. 5. On the other hand, a bottom surface of the recessed portion 91aA of the board housing portion 91A in the board holder 9A of the embodiment has a shape with recessed and projected areas as illustrated in the lower portion of FIG. 1. This is due to the configuration of the circuit board 10A of the waterproof electronic pen 1A according to the embodiment.

The circuit board 10A has a two-surface structure (two-layer board) in which the circuit components are installed on both surfaces including a lower surface (one surface) 10a and an upper surface (another surface) 10b as illustrated in the center portion of FIG. 1. The conductor patterns 101 and 102 forming a connection terminal, circuit elements such as capacitors 103 and 105, a side switch 104, and the like are provided on the upper surface (another surface) 10b. Moreover, various circuit components for mainly realizing new functions, such as a control IC (Integrated Circuit) 106, a battery 107, and a wireless communication module 108, are provided on the lower surface (one surface) 10a of the circuit board 10A facing the bottom surface of the recessed portion 91aA when the circuit board 10A is housed in the recessed portion 91aA of the board housing portion 91A.

To house and stably hold the circuit board 10A with the two-surface structure, board mounting portions 91b and 91c projecting approximately 1 mm inside and extending in a longitudinal direction are provided on an inner side wall on a deep side of the recessed portion 91aA of the board housing portion 91A as illustrated in the lower portion of FIG. 1. Similarly, board mounting portions 91d and 91e corresponding to the board mounting portions 91b and 91c are also provided on an inner side wall of the recessed portion 91aA of the board holder 9A on a near side in the lower portion of FIG. 1. Note that the board mounting portions 91d and 91e are provided on the inner side wall on the near side, and therefore, the board mounting portions 91d and 91e cannot be seen in the lower portion of FIG. 1. Moreover, a board mounting portion 91f is provided on an inner end portion on the nib side of the recessed portion 91aA of the board housing portion 91A, and a board mounting portion 91g is provided on an inner end portion on a back end side.

In this way, in the center portion of FIG. 1, the circuit board 10A is mounted on the board mounting portions 91b, 91c, 91d, 91e, 91f, and 91g provided on the inner side walls of the recessed portion 91aA, and the lower surface (one surface) of the circuit board 10A faces the bottom surface of the recessed portion 91aA. In this case, the board mounting portions 91*b*, 91*c*, 91*d*, 91*e*, 91*f*, and 91*g* are engaged with a side part (outer edge part) of the lower surface (one surface) of the circuit board 10A. Moreover, the heights of the board mounting portions 91*b*, 91*c*, 91*d*, 91*e*, 91*f*, and 91*g* are adjusted to the same height so that the highest circuit component provided on the lower surface (one surface) 10*a* of the circuit board 10A mounted on the board mounting portions 91*b*, 91*c*, 91*d*, 91*e*, 91*f*, and 91*g* does not come into contact with the bottom surface of the recessed portion 91*a*A.

Therefore, the board mounting portions 91*b*, 91*c*, 91*d*, 91*e*, 91*f*, and 91*g* regulate a position in a depth direction of the circuit board 10A housed in the recessed portion 91*a*A. This prevents the highest circuit component provided on the lower surface (one surface) 10*a* of the circuit board 10A from coming into contact with the bottom surface of the recessed portion 91*a*A. That is, this prevents various circuit components provided on the lower surface (one surface) 10*a* of the circuit board 10A from coming into contact with the bottom surface of the recessed portion 91*a*A, and various circuit components are not stressed. In addition, the circuit board 10A housed in the recessed portion 91*a*A does not rattle in a depth direction of the recessed portion 91*a*A.

In addition, a semi-cylindrical protrusion 91*h* is provided on the inner side wall on the deep side of the recessed portion 91*a*A of the board holder 9A as illustrated in the lower portion of FIG. 1. Similarly, a semi-circular protrusion 91*i* corresponding to the protrusion 91*h* is also provided on the inner side wall of the recessed portion 91*a*A of the board holder 9A on the near side in the lower portion of FIG. 1. Note that the protrusion 91*i* is provided on the inner side wall on the near side of the recessed portion 91*a*A of the board holder 9A, and therefore, the protrusion 91*i* cannot be seen in the lower portion of FIG. 1. The protrusions 91*h* and 91*i* are fitted to cut-out portions 109*a* and 109*b* of the circuit board 10A to regulate the position of the circuit board 10A such that the circuit board 10A is prevented from being moved in the longitudinal direction inside of the recessed portion 91*a*A. In this way, the board mounting portions 91*b*, 91*c*, 91*d*, 91*e*, 91*f*, and 91*g* and the protrusions 91*h* and 91*i* can stabilize and hold the circuit board 10A in the recessed portion 91*a*A.

Moreover, in the case of the waterproof electronic pen 1A of the embodiment, an opening of the recessed portion 91*a*A is sealed by the sealing member 11 while the circuit board 10A is housed in the recessed portion 91*a*A of the board housing portion 91A included in the board holder 9A. The sealing member 11 is formed by, for example, a hot-melt adhesive. That is, hot-melt molding is applied from an upper surface (another surface) side of the circuit board 10A housed in the recessed portion 91*a*A. The hot-melt molding is a molding technique of injecting a thermoplastic hot-melt adhesive (thermosetting resin) into a mold at low pressure, and the injection at low pressure in the technique allows overmolding without damaging electronic components and the like.

This can realize waterproofing of the circuit components provided on the upper surface (another surface) 10*b* of the circuit board 10A without affecting the circuit components provided on the upper surface 10*b*. Moreover, the sealing member 11 can fill the widely opened opening on the upper side of the recessed portion 91*a*A of the board housing portion 91A to seal the board housing portion 91A of the board holder 9, and water or the like does not enter the board housing portion 91A. This can also realize waterproofing of various circuit components provided on the lower surface (one surface) 10*a* of the circuit board 10A.

Note that the thickness of a side switch pressing portion 11*a* of the sealing member 11 corresponding to the part provided with the side switch 104 of the circuit board 10A is thinner than the other parts as illustrated in the upper portion of FIG. 1. This prevents the pressing operation of the side switch 104 from becoming difficult.

Moreover, as described above, the board mounting portions 91*b*, 91*c*, 91*d*, 91*e*, 91*f*, and 91*g* regulate the position of the circuit board 10A in the depth direction of the recessed portion 91*a*A when the circuit board 10A is housed in the recessed portion 91*a*A of the board housing portion 91. As a result, the highest circuit component provided on the lower surface (one surface) 10*a* of the circuit board 10A does not come into contact with the bottom surface of the recessed portion 91*a*A. However, the configuration generates a relatively large gap between a part of the lower surface (one surface) 10*a* of the circuit board 10A not provided with a circuit component or a part provided with a circuit component not so high in height and the bottom surface of the recessed portion 91*a*A.

In addition, as described above, the opening of the recessed portion 91*a*A of the board housing portion 91A is sealed by the sealing member 11. Therefore, when the waterproof electronic pen 1A is dropped, for example, in the water such as a pool, the water pressure is applied to the waterproof electronic pen 1A, and the gap (air layer) generated between the lower surface (one surface) 10*a* of the circuit board 10A and the bottom surface of the recessed portion 91*a*A is compressed by the water pressure. In this case, the waterproof electronic pen 1A may be slightly arched and warped inside of the gap (toward the sealing member 11). When the circuit board 10A is warped and deformed, the circuit part provided on the circuit board 10A may be stressed, and the characteristics may be changed so that the circuit part does not normally operate. In addition, the side switch 104 provided on the circuit board 10A may be pressed against the press operator 22 provided on the housing 2, and the side switch 104 may be continuously pressed.

Therefore, projected portions 91*x*, 91*y*, and 91*z* are provided on parts of the lower surface (one surface) 10*a* of the circuit board 10A of the waterproof electronic pen 1A not provided with the circuit components and on parts of the bottom surface of the recessed portion 91*a*A facing the parts provided with circuit components not so high in height. As a result, the gap (air layer) generated between the lower surface (one surface) 10*a* of the circuit board 10A and the bottom surface of the recessed portion 91*a*A is reduced as much as possible, and not only the waterproof function, but also the resistance function against the water pressure is provided.

FIG. 2 is a cross-sectional view for describing the configuration of the board holder 9A and circuit board 10A part included in the waterproof electronic pen 1A of the embodiment. As illustrated in FIG. 2, three parts including the board holder 9A, the circuit board 10A, and the sealing member 11 are layered from the lower side to form one electronic circuit portion as a whole. As also described above, the circuit board 10A housed in the recessed portion 91*a*A of the board housing portion 91A of the board holder 9A is mounted on the board mounting portions 91*b*, 91*c*, 91*d*, 91*e*, 91*f*, and 91*g*, and the position in the depth direction of the recessed portion 91*a*A is regulated.

Moreover, the projected portions 91*x*, 91*y*, and 91*z* are provided on the parts of the lower surface (one surface) 10*a* of the circuit board 10A not provided with circuit components and on the parts of the bottom surface of the recessed portion 91aA facing the parts provided with circuit components not so high in height. This can significantly reduce the gap (air layer) generated between the lower surface (one surface) 10a of the circuit board 10A and the recessed portion 91aA. Moreover, even if the waterproof electronic pen 1A of the embodiment is dropped in a pool or the like and placed under the conditions of water pressure, the parts to be deformed by the water pressure can be eliminated, and this can sufficiently provide the resistance to water pressure in addition to the waterproof function.

Note that, in the waterproof electronic pen 1A of the embodiment, the board mounting portion 91f provided on the nib side of the board housing portion 91A and the board mounting portion 91g on the back end side project inside of the recessed portion 91aA and act to reduce the gap in the recessed portion 91aA. In addition, as can also be understood from FIG. 2, the thickness of the sealing member 11 is thin at the side switch 104 part, and the pressing operation of the side switch 104 does not become difficult.

Configuration of Side Surface of Board Holder 9A

Figure 3A:
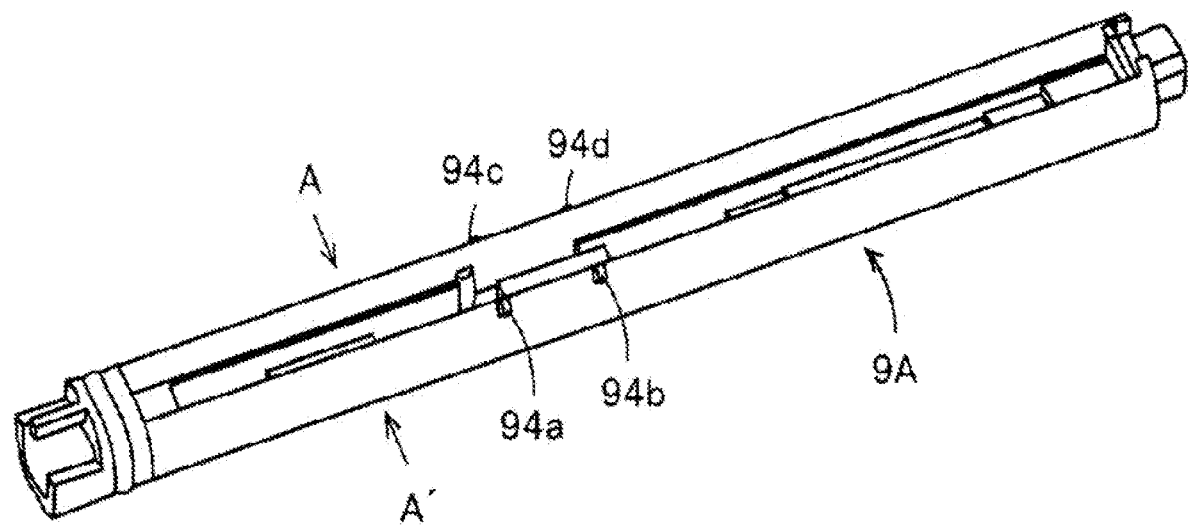
FIGS. 3A and 3B illustrate diagrams for describing a configuration of an outer side surface of the board holder of the waterproof electronic pen according to the embodiment of the present disclosure.
Figure 3B:
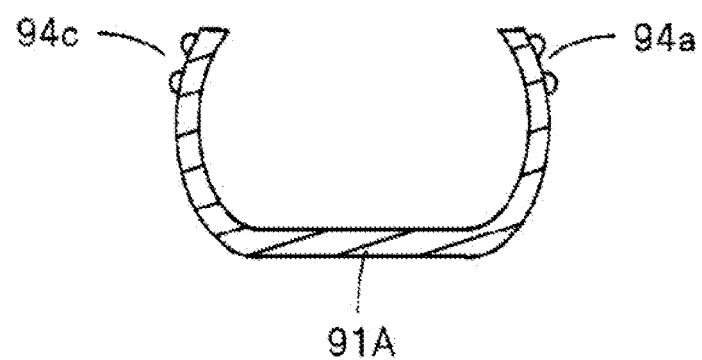

FIGS. 3A and 3B illustrate diagrams for describing a configuration of a side surface of the board holder of the waterproof electronic pen 1A according to the embodiment. As illustrated in FIG. 2, the projected portions 91x, 91y, and 91z can be provided on the bottom surface of the recessed portion 91aA of the board housing portion 91 to prevent the waterproof electronic pen 1A from being significantly warped and deformed. However, even when the projected portions 91x, 91y, and 91z are provided on the bottom surface of the recessed portion 91aA, the gap between the lower surface (one surface) of the circuit board 10A and the bottom surface of the recessed portion 91aA cannot be completely eliminated. In this case, when, for example, the waterproof electronic pen 1A is dropped in the water, the waterproof electronic pen 1A may be affected by water pressure and slightly arched and warped, although not so much as to affect the circuit components installed on the circuit board 10A.

Therefore, to prevent an erroneous operation of the side switch 104 due to the slight deformation, protrusions 94a, 94b, 94c, and 94d for preventing the erroneous operation of the side switch 104 are provided on an outer side surface of the board housing portion 91A of the board holder 9A. In FIGS. 3A and 3B, FIG. 3A is an external view of the board holder 9A, and FIG. 3B illustrates a cross-sectional view cut at a position indicated by a position AA' illustrated in FIG. 3A.

As also illustrated in FIG. 1 and as also illustrated in FIG. 3A, the circuit board 10A is housed in the recessed portion 91aA of the board housing portion 91A of the board holder 9A in the illustrated case. In this case, the protrusion 94a and the protrusion 94b are provided on an outer side surface of the board holder 9A to sandwich the side switch 104 installed on the circuit board 10A in the longitudinal direction, and similarly, the protrusion 94c and the protrusion 94d are provided on an outer side surface on an opposite side. As a result, the side switch 104 installed on the circuit board 10A can be placed between the protrusion 94a and the protrusion 94c and placed between the protrusion 94b and the protrusion 94d in a direction crossing the longitudinal direction.

That is, as can be understood by viewing FIG. 3A, the side switch 104 of the circuit board 10A housed in the recessed portion 91aA of the board housing portion 91A is positioned inside of a rectangle with vertices at the protrusions 94a, 94b, 94c, and 94d. Each of the protrusions 94a, 94b, 94c, and 94d is provided on an upper end side of the outer side surface of the board holder 9A as illustrated in FIG. 3B. Moreover, as described with reference to FIG. 2, it is assumed that the electronic circuit portion including the board holder 9A, the circuit board 10A, and the sealing member 11 pushes up the side switch 104 so that the side switch 104 is arched and warped slightly.

In this case, the protrusions 94a, 94b, 94c, and 94d provided on the outer side surface of the board housing portion 91A and the surface inside of the housing 2 come into contact to forcibly prevent the side switch 104 from being pushed out toward the housing 2 by more than a predetermined amount. This can surely prevent the erroneous operation of the side switch 104 even when the waterproof electronic pen 1A is slightly warped and deformed due to the water pressure.

Waterproofing of Coil Member and Pen Pressure Detection Module Part

In the waterproof electronic pen 1A of the embodiment, the part provided with the coil member 5 and the pen pressure detection module 8 on the nib side also has a waterproof function. Specifically, the cap member 4 is provided on the nib side as in the case described with reference to FIG. 5. The cap member 4 is mounted in close contact with the nib side of the coil member 5. Moreover, when the coil member 5 provided with the cap member 4 is installed in the housing 2 and positioned at a predetermined position on the nib side, the outer edge portion of the cap member 4 comes into close contact with an inner wall surface of the housing 2. As a result, the cap member 4 provided on the nib part in the housing 2 can prevent the moisture from entering the opening (opening where the front end portion 32 of the core 3 protrudes) provided on the tapered front end portion on the nib side of the housing 2.

In addition, as in the case described with reference to FIG. 5, the ring-shaped sealing member 93A is provided on the nib side of the board holder 9A in the case of the waterproof electronic pen 1A according to the embodiment as illustrated in the lower portion of FIG. 1 and FIG. 2. When the sealing member 93A is in close contact with the surroundings on the front end side of the board holder 9A and the board holder 9A is positioned in the housing 2, the sealing member 93A also comes into close contact with the inner wall of the housing 2 without a gap. As a result, even if moisture enters from the opening part closed by the cap 21 on the back end side of the housing 2, the sealing member 93A prevents the moisture from reaching the nib side where the pen pressure detection module 8 and the coil member 5 are provided.

In this way, the waterproof function is also secured for a space on the nib side where the coil member 5 and the pen pressure detection module 8 are provided. Moreover, the strong waterproof function is also secured for the electronic circuit part including the board holder 9A, the circuit board 10A, and the sealing member 11 as described above. As a result, the waterproof electronic pen 1A has a strong waterproof function as a whole.

Advantageous Effects of Embodiment

In the waterproof electronic pen of the embodiment, the projected portions 91x, 91y, and 91z are provided on the bottom surface of the recessed portion 91aA of the board holder 9A according to the circuit components and the like provided on the lower surface (one surface) 10a of the circuit board 10A facing the bottom surface. This can reduce the gap generated between the bottom surface of the recessed portion 91aA of the board holder 9A and the lower surface (one surface) 10a of the circuit board 10A, and high resistance to water pressure can be provided.

In addition, the sealing member 11 is used for sealing while the circuit board 10A is housed in the board housing portion 91A of the board holder 9, and both the lower surface (one surface) and the upper surface (another surface) of the circuit board 10A can be protected from water or the like from the outside. That is, a high waterproof function can be realized.

In addition, the protrusions 94a, 94b, 94c, and 94d can be provided on the outer side surface of the board holder 9A, near the side switch 104 of the circuit board 10A, to prevent an erroneous operation of the side switch 104 even if there is slight arching and warping due to water pressure.

In addition, the cap member 4 and the sealing member 93 are provided to realize a high waterproof function also for the part on the nib side provided with the coil member 5 and the pen pressure detection module 8.

The functions can be provided to realize a highly reliable waterproof electronic pen having both the waterproof function and the resistance to water pressure. The waterproof electronic pen can be used underwater and can be used as a position indicator (stylus) for an electronic device provided with a position detection apparatus that can be used underwater.

Modifications

Although the waterproof electronic pen 1A of the embodiment is applied to the electronic pen of the electro-magnetic resonance system in the example described above, the example is not limited to this. The invention can also be applied to electronic pens of other systems such as a capacitance system. For example, in a case of the electronic pen of the capacitance system, the components of the electronic circuit formed on the circuit board and the coil member are not included, and the electronic pen is configured to transmit, from a conductive core, a position indication signal from the circuit board. Other components are similar to the components of the above-described electronic pen of the electro-magnetic resonance system.

In addition, although the sealing member 11 is formed by what is called hot-melt molding using a hot-melt adhesive in the embodiment described above, the sealing member 11 is not limited to this. For example, various methods that can realize a sufficiently strong waterproof function, such as using an adhesive that functions at room temperature to bond the sealing member 11 formed by a resin, can be used to provide the sealing member 11 on the other surface 10b of the circuit board 10A housed in the board holder 9A.

In addition, although the projected portions 91x, 91y, and 91z are provided on the bottom surface of the recessed portion 91aA of the board housing portion 91A in the embodiment described above, the arrangement is not limited to this. One or more protrusions with different heights or different planarity with respect to the circuit board 10A can be provided at various positions according to the circuit components installed on the lower surface (one surface) of the circuit board 10A facing the bottom surface of the recessed portion 91aA or according to the parts not provided with the circuit components. Therefore, if the circuit board housed in the board holder 9A is changed, the shapes and the number of protrusions provided on the bottom surface of the recessed portions 91aA also vary.

In addition, although the projected portions 91x, 91y, and 91z are provided on the bottom surface of the recessed portion 91aA of the board housing portion 91A in the embodiment described above, the projected portions may not be provided at all. For example, if only the waterproof ability corresponding to moisture or humidity is necessary when the electronic pen is used outdoors in the rain or when the electronic pen is used in a place with much moisture such as in the kitchen, the resistance to water pressure is not necessary. In this case, circuit components easily affected by heat are installed on the surface (one surface) of the circuit board 10A facing the recessed portion 91aA when the circuit board 10A is installed on the recessed portion 91aA of the board housing portion 91A. Moreover, a side switch and a capacitor are installed on the surface (another surface) of the circuit board 10A exposed to the outside when the circuit board 10A is installed on the recessed portion 91aA.

Moreover, if, for example, a thermosetting resin is used on the other surface of the circuit board 10A for sealing, the waterproof function can be sufficiently secured even if there is a gap between the circuit board 10A and the bottom surface of the recessed portion 91aA because the recessed portion 91aA of the board housing portion 91A is a plane without recessed and projected areas. Therefore, an electronic pen with high water resistance can be realized without resistance to water pressure.

DESCRIPTION OF REFERENCE SYMBOLS

1A . . . Waterproof electronic pen, 2 . . . Housing (case), 21 . . . Cap, 22 . . . Press operator, 3 . . . Core, 31 . . . Core body portion, 32 . . . Front end portion, 4 . . . Cap member, 5 . . . Coil member, 51 . . . Coil, 52 . . . Ferrite core, 6 . . . Coil member holder, 7 . . . Pressing member, 8 . . . Pen pressure detection module, 81 . . . Pen pressure detector, 82 . . . Pen pressure transmission member, 9A . . . Board holder, 91A . . . Board housing portion, 91aA . . . Recessed portion, 91b, 91c, 91d, 91e, 91f, 91g . . . Board mounting portion, 91x, 91y, 91z . . . Projected portion, 92A . . . Fitting portion, 93A . . . Sealing member, 10A . . . Circuit board, 10a . . . Lower surface (one surface), 10b . . . Upper surface (another surface), 101, 102 . . . Connection terminal, 103, 105 . . . Capacitor, 104 . . . Side switch, 106 . . . Control IC, 107 . . . Battery, 108 . . . Wireless communication module, 109a, 109b . . . Cut-out portion, 11 . . . Sealing member, 11a . . . Side switch pressing portion, 94a, 94b, 94c, 94d . . . Protrusion

The invention claimed is:

1. A waterproof electronic pen that transmits a position indication signal, the waterproof electronic pen comprising:
   a board housing including a recessed portion having an opening over a lower surface of the recessed portion;
   a circuit board;
   a board holder disposed in the board housing, the board holder being configured to hold the circuit board in the recessed portion of the board housing;
   a plurality of circuit components including first components arranged on a first surface of the circuit board, and a press switch and a capacitor arranged on a second surface of the circuit board,
   wherein the first surface faces the lower surface of the recessed portion of the board housing,
   wherein the lower surface of the recessed portion of the board housing includes a plurality of projected portions that fill a space between the circuit board and the lower surface of the recessed portion of the board housing provided according to the circuit components arranged on the first surface of the circuit board and form recessed and projected areas, and
   wherein at least one of the projected portions extends from the lower surface of the recessed portion of the board housing to the circuit board; and a thermosetting resin formed over the second surface of the circuit board that seals the opening over the lower surface of the recessed portion of the board housing.

2. A waterproof electronic pen comprising:

a board housing including a recessed portion having an opening over a lower surface of the recessed portion;

a circuit board;

a board holder disposed in the board housing, the board holder being configured to hold the circuit board in the recessed portion of the board housing, wherein the lower surface of the recessed portion of the board housing faces a first surface of the circuit board housed in the recessed portion of the board housing and includes a plurality of projected portions that fill a space between the circuit board and the lower surface of the recessed portion of the board housing provided according to circuit components on the first surface of the circuit board and form recessed and projected areas, and wherein at least one of the projected portions extends from the lower surface of the recessed portion of the board housing to the circuit board; and a sealing member that seals the opening over the lower surface of the recessed portion of the board housing, wherein the sealing member is disposed on a second surface of the circuit board housed in the recessed portion of the board housing.

3. The waterproof electronic pen according to claim 2, wherein:

the circuit components are more affected by heat than second circuit components provided on the second surface of the circuit board, and the sealing member is formed from a hot-melt molding applied to the second surface of the circuit board.

4. The waterproof electronic pen according to claim 3, wherein:

the circuit components on the first surface of the circuit board include one or more of a power circuit, a wireless communication circuit, and an integrated circuit.

5. The waterproof electronic pen according to claim 2, wherein:

at least a side switch is provided on the second surface of the circuit board, and the sealing member is configured such that the side switch is able to be pressed.

6. The waterproof electronic pen according to claim 5, wherein:

one or more protrusions are provided on an outer surface of the board housing, proximate to the side switch provided on the second surface of the circuit board housed in the board housing.

7. The waterproof electronic pen according to claim 2, further comprising:

a housing in which a core, a pen pressure detector, and the board holder connected in series are housed, a cap member provided between the housing and the core, and a ring-shaped sealing member provided between the housing and the board housing at an end portion of the board housing, and the cap member and the sealing member contact an inner wall of the housing and seal a portion of the housing including at least the pen pressure detector.

8. The waterproof electronic pen according to claim 7, further comprising:

a ferrite core provided around the core; and a coil wound around the ferrite core, wherein first and second ends of the coil are connected to a capacitor provided on the circuit board, and the coil and the capacitor form a resonant circuit.

* * * * *